United States Patent
Lee et al.

(10) Patent No.: US 7,547,920 B2
(45) Date of Patent: Jun. 16, 2009

(54) PATTERN MASK, LIGHT-EMITTING UNIT MANUFACTURED USING THE SAME, DISPLAY APPARATUS MANUFACTURED USING THE SAME AND METHOD OF MANUFACTURING DISPLAY APPARATUS USING THE SAME

(75) Inventors: Dong-Won Lee, Seongnam-si (KR); Joon-Hoo Choi, Seoul (KR); Jin-Koo Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/995,477

(22) Filed: Nov. 24, 2004

(65) Prior Publication Data
US 2005/0133802 A1    Jun. 23, 2005

(30) Foreign Application Priority Data
Nov. 28, 2003   (KR) ...................... 10-2003-0085763

(51) Int. Cl.
*H01L 27/15* (2006.01)
(52) U.S. Cl. .......................................... 257/79; 257/93
(58) Field of Classification Search .................. 257/79, 257/88, 93
See application file for complete search history.

(56) References Cited

U.S. PATENT DOCUMENTS
7,015,503 B2 *   3/2006   Seki et al. ...................... 257/40

* cited by examiner

*Primary Examiner*—Mark Prenty
(74) *Attorney, Agent, or Firm*—Cantor Colburn LLP

(57) ABSTRACT

A display apparatus includes a light-emitting unit. The light-emitting unit includes a first electrode, a bank, an organic light-emitting layer and a second electrode. The first electrode is formed on a substrate. The first electrode receives a first driving signal from a circuit unit. The bank surrounds sides of the first electrode and has a receiving portion formed on an upper face of the bank. The organic light-emitting layer is formed on the first electrode. The second electrode is formed on the organic light-emitting layer. The second electrode receives a second driving signal from the circuit unit. Therefore, even though the organic light-emitting material is abnormally dropped onto an unintended position, the receiving portion prevents the organic light-emitting material from flowing into a neighboring cavity, so that yield increases and productivity is enhanced.

3 Claims, 15 Drawing Sheets

PATTERN MASK, LIGHT-EMITTING UNIT MANUFACTURED USING THE SAME, DISPLAY APPARATUS MANUFACTURED USING THE SAME AND METHOD OF MANUFACTURING DISPLAY APPARATUS USING THE SAME

CROSS-REFERENCE TO RELATED APPLICATIONS

This application relies for priority upon Korean Patent Application No.2003-85763 filed on Nov. 28, 2003, the contents of which are herein incorporated by reference in its entirety.

BACKGROUND OF THE INVENTION

1. Field of the Invention

The present invention relates to a pattern mask, a light-emitting unit manufactured by using the pattern mask, a display apparatus manufactured by using the pattern mask, and a method of manufacturing the display apparatus by using the pattern mask. More particularly, the present invention relates to a pattern mask capable of enhancing productivity, a light-emitting unit manufactured by using the pattern mask, a display apparatus manufactured by using the pattern mask, and a method of manufacturing the display apparatus by using the pattern mask.

2. Description of the Related Art

Recently, an information processing apparatus is used in various fields. Data processed by the information processing apparatus generates electric signals. Therefore, the information processing apparatus includes a display apparatus that converts the electric signals into light so that a user may recognize an output processed by the information processing apparatus.

The display apparatus may be classified into an emissive type display apparatus and a non-emissive type display apparatus.

The emissive type display apparatus displays an image using light generated by an emissive element. The emissive type display apparatus include a cathode ray tube (CRT) display apparatus, a plasma display panel (PDP), a light-emitting display (LED) apparatus, etc.

The non-emissive type display apparatus displays an image using light generated by a backlight assembly, an external light etc. The non-emissive type display apparatus include a liquid crystal display (LCD) apparatus, an electrochemical display (ECD) apparatus, an electrophoretic image display (EPID), etc.

The LED may be classified into an organic light-emitting display (OLED) apparatus and an inorganic light-emitting display apparatus depending on materials for emitting light.

Electrons emitted by high voltage collide with light-emitting center of the inorganic light-emitting display apparatus to generate the light.

The OLED includes an anode, a cathode and an organic light-emitting layer interposed between the anode and the cathode. When electrons from the anode are combined with holes from the cathode in the organic light-emitting layer, excitons of high energy are generated. When the excitons are transferred from an excited state to a ground state, light is generated.

In order to form the organic light-emitting layer, a screen-printing method or a printing method may be employed.

According to the screen-printing method, organic light-emitting materials may be formed on proper positions through openings of a mask.

According to the printing method, the organic light-emitting materials may be dropped on predetermined positions. In detail, banks are formed on the anode, and droplets of the organic light-emitting materials are dropped onto cavities defined by the banks. Then, the organic light-emitting materials that fill the cavities are dried to form the organic light-emitting layer.

Recently, as a resolution of the display apparatus is enhanced, the number of anodes per unit area increases, and a distance between the anodes decreases. When droplets of the organic light-emitting material are not dropped onto the positions, yield of the OLED apparatus decreases. In addition, when the droplets of the organic light-emitting material are not dropped onto the cavities, additional droplets are dropped onto the empty cavities so that productivity of the OLED apparatus is lowered.

SUMMARY OF THE INVENTION

The present invention provides a pattern mask for forming a bank of a display apparatus.

The present invention also provides a light-emitting unit manufactured by using the pattern mask.

The present invention also provides a display apparatus manufactured by using the pattern mask.

The present invention also provides a method of manufacturing a display apparatus by using the pattern mask.

In an exemplary pattern mask according to the present invention, the pattern mask includes a light blocking region, a plurality of first light-transmitting regions and a plurality of second light-transmitting regions. The light-blocking region blocks light. The first light-transmitting regions transmit light. The first light-transmitting regions are formed adjacent to the light-blocking region such that the first light-transmitting regions are arranged in a matrix shape. The second light-transmitting regions transmit light. The second light-transmitting regions are between the first light-transmitting regions.

In another exemplary pattern mask according to the present invention, the pattern mask includes a transparent substrate, a plurality of first light blocking patterns and a plurality of second light blocking patterns. The first light blocking patterns are on the transparent substrate in a matrix shape. The second light blocking patterns are between the first light blocking patterns.

In another exemplary light-emitting unit according to the present invention, the light-emitting unit includes a first electrode, a bank, an organic light-emitting layer and a second electrode. The first electrode is formed on a substrate. The first electrode receives a first driving signal from a circuit unit. The bank surrounds sides of the first electrode. The bank has a receiving portion on an upper face of the bank. The organic light-emitting layer is formed on the first electrode. The second electrode is formed on the organic light-emitting layer. The second electrode receives a second driving signal from the circuit unit.

In an exemplary display apparatus according to the present invention, the display apparatus includes a light-emitting unit. The light-emitting unit includes a first electrode, a bank, an organic light-emitting layer and a second electrode. The first electrode is formed on a substrate. The first electrode receives a first driving signal from a circuit unit. The bank surrounds sides of the first electrode, and has a receiving portion formed on an upper face of the bank. The organic light-emitting layer is formed on the first electrode. The second electrode is formed on the organic light-emitting layer. The second electrode receives a second driving signal from the circuit unit.

In an exemplary display apparatus according to the present invention, the display apparatus includes a switching device, a driver device and a light-emitting unit. The switching device is formed on a substrate to output an image signal. The driver device is formed on the substrate. The driver device outputs a first driving signal based on the image signal. The light-emitting unit includes a first electrode, a bank, an organic light-emitting layer and a second electrode. The first electrode is formed on the substrate. The first electrode receives the first driving signal. The bank surrounds sides of the first electrode. The bank has a receiving portion on an upper face of the bank. The organic light-emitting layer is formed on the first electrode. The second electrode is formed on the organic light-emitting layer. The second electrode receives a second driving signal from the circuit unit.

In an exemplary method of manufacturing a display apparatus according to the present invention, a first electrode that receives a first driving signal from a circuit unit is formed on a substrate having the circuit unit formed thereon. A bank is formed on the substrate. The bank surrounds sides of the first electrode, and has a receiving portion formed on an upper face of the bank is formed on the first substrate. An organic light-emitting layer is formed on the first electrode. Then, a second electrode that receives a second driving signal from the circuit unit is formed on the organic light-emitting layer.

According to the present invention, the bank includes the receiving portion. Therefore, even though the organic light-emitting material is dropped onto an unintended position, the receiving portion prevents the organic light-emitting material from flowing into a neighboring cavity, so that a yield of the display apparatus increases to enhance productivity of the display apparatus.

BRIEF DESCRIPTION OF THE DRAWINGS

The above and other features and advantages of the present invention will become more apparent by describing in detailed exemplary embodiments thereof with reference to the accompanying drawings, in which.

DESCRIPTION OF EMBODIMENTS

Hereinafter, the embodiments of the present invention will be described in detail with reference to the accompanied drawings.

Pattern Mask

Figure 1:
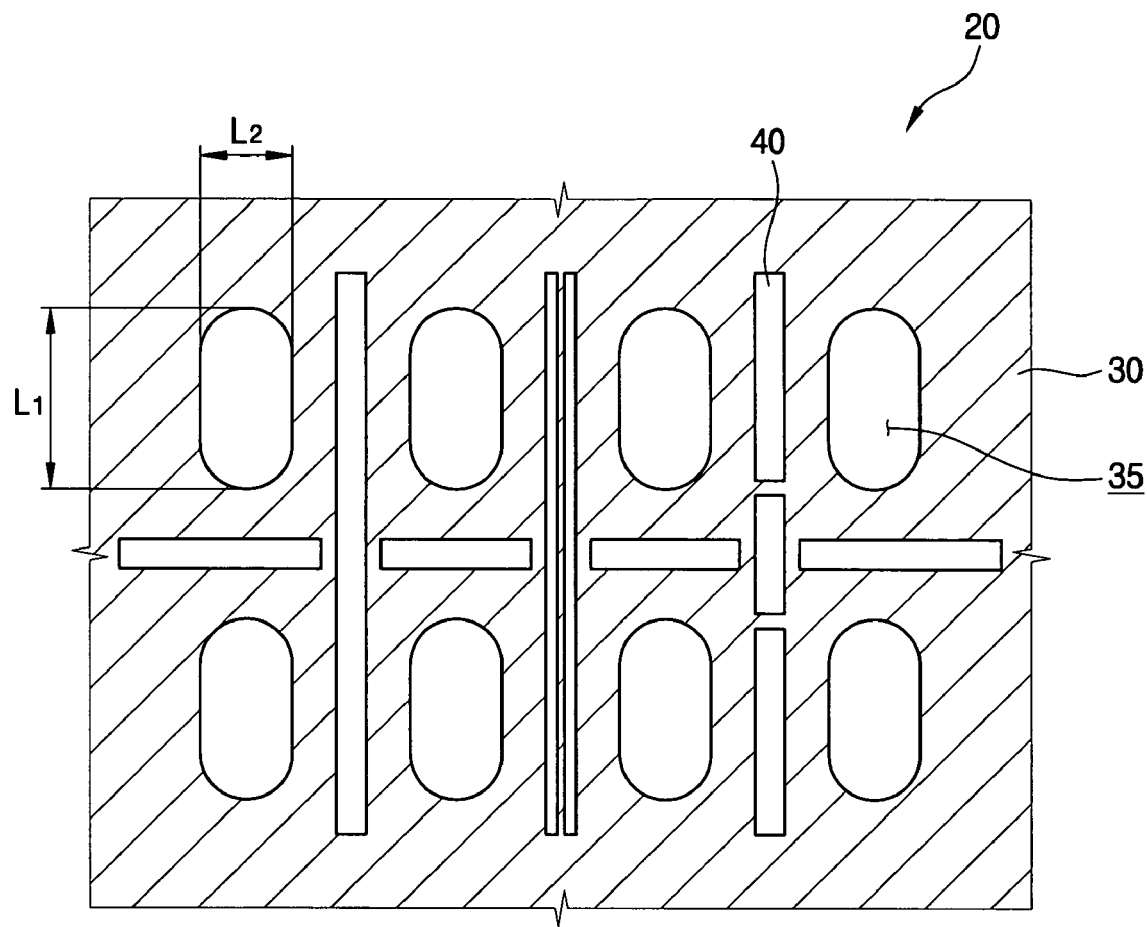
FIG. 1 is a plan view illustrating a pattern mask according to an exemplary embodiment of the present invention.
Figure 1:
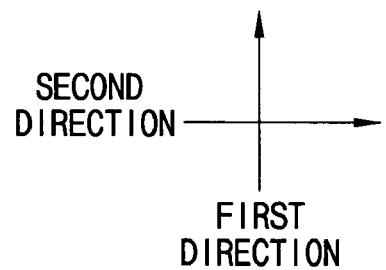
Figure 2:
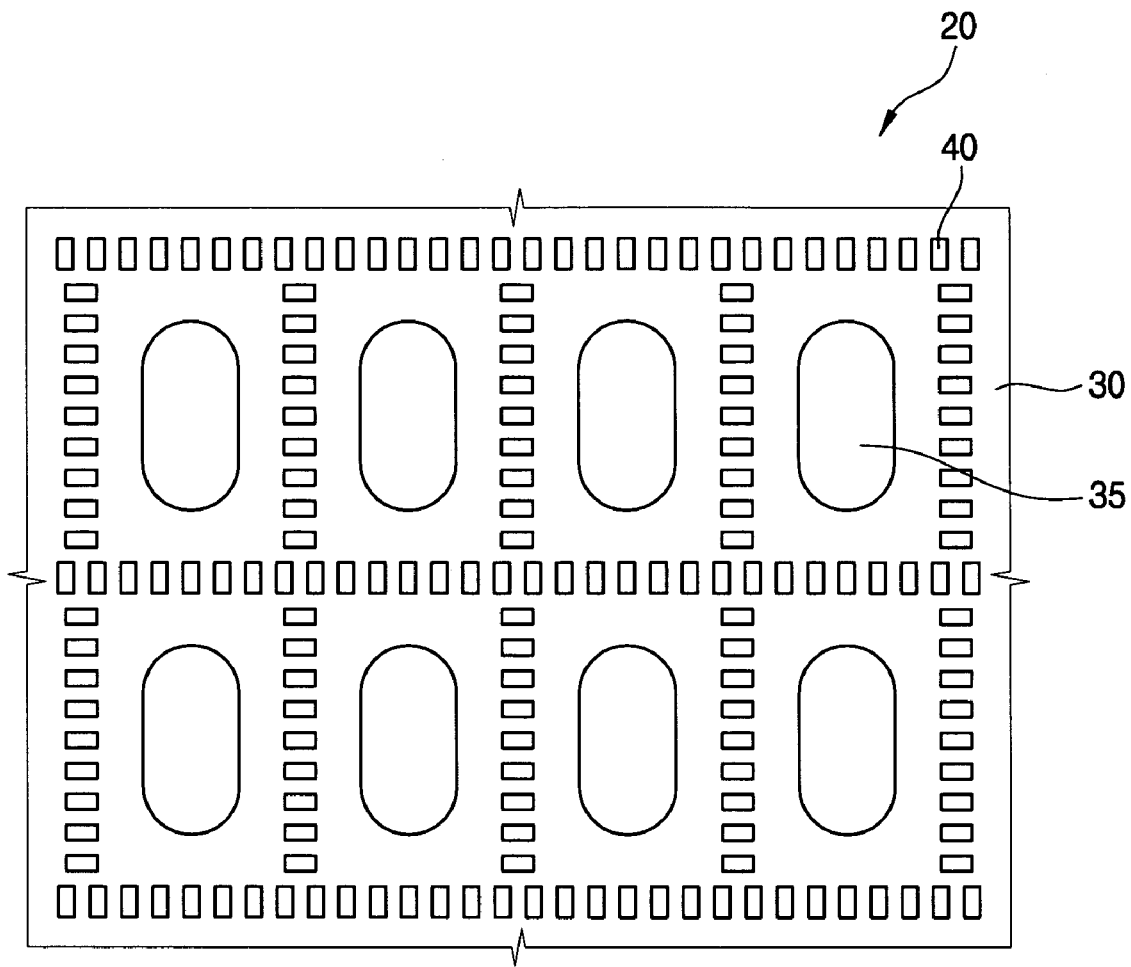
FIG. 2 is a plan view illustrating a pattern mask according to another exemplary embodiment of the present invention.
Figure 2:
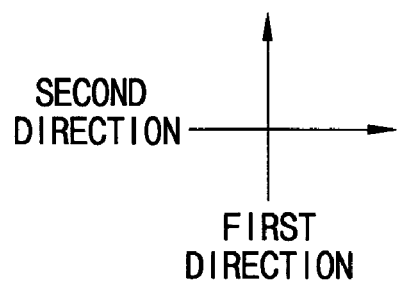

FIG. 1 is a plan view illustrating a pattern mask according to an exemplary embodiment of the present invention, and FIG. 2 is a plan view illustrating a pattern mask according to another exemplary embodiment of the present invention.

Referring to FIGS. 1 and 2, a pattern mask 20 according to the present invention includes a light-blocking region 30, a plurality of first light-transmitting regions 35 and a plurality of second light-transmitting regions 40.

The light-blocking region 30 surrounds the first light-transmitting regions 35 and the second light-transmitting regions 40.

The first light-transmitting regions 35 are adjacent to the light-blocking region 30 in a matrix shape. The first light blocking regions 35 correspond to cavities 225 in FIG. 10C that are to be explained, respectively.

The second light-transmitting regions 40 are between the first light-transmitting regions 35. The second light blocking regions 35 correspond to receiving portions 220e in FIG. 10C that are to be explained, respectively.

Each of the second light-transmitting regions 40 may have various shapes, and be arranged in various ways.

Figure 10A:
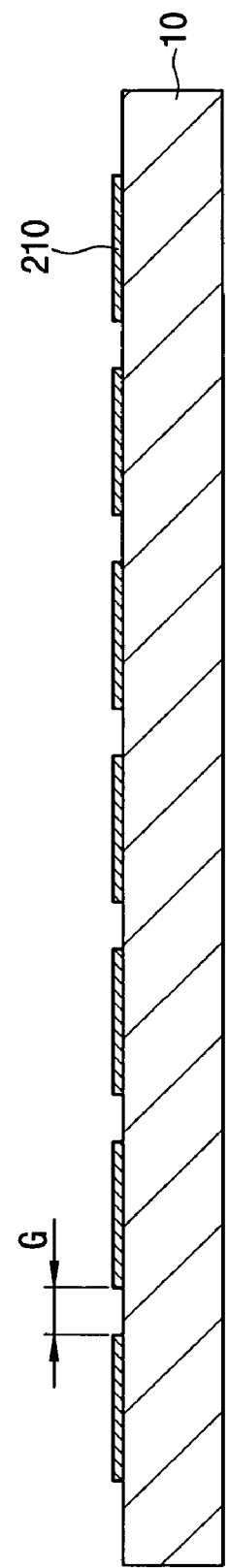
FIGS. 10A to 10H are cross-sectional views illustrating a process of manufacturing a display apparatus according to an exemplary embodiment of the present invention.
Figure 10B:
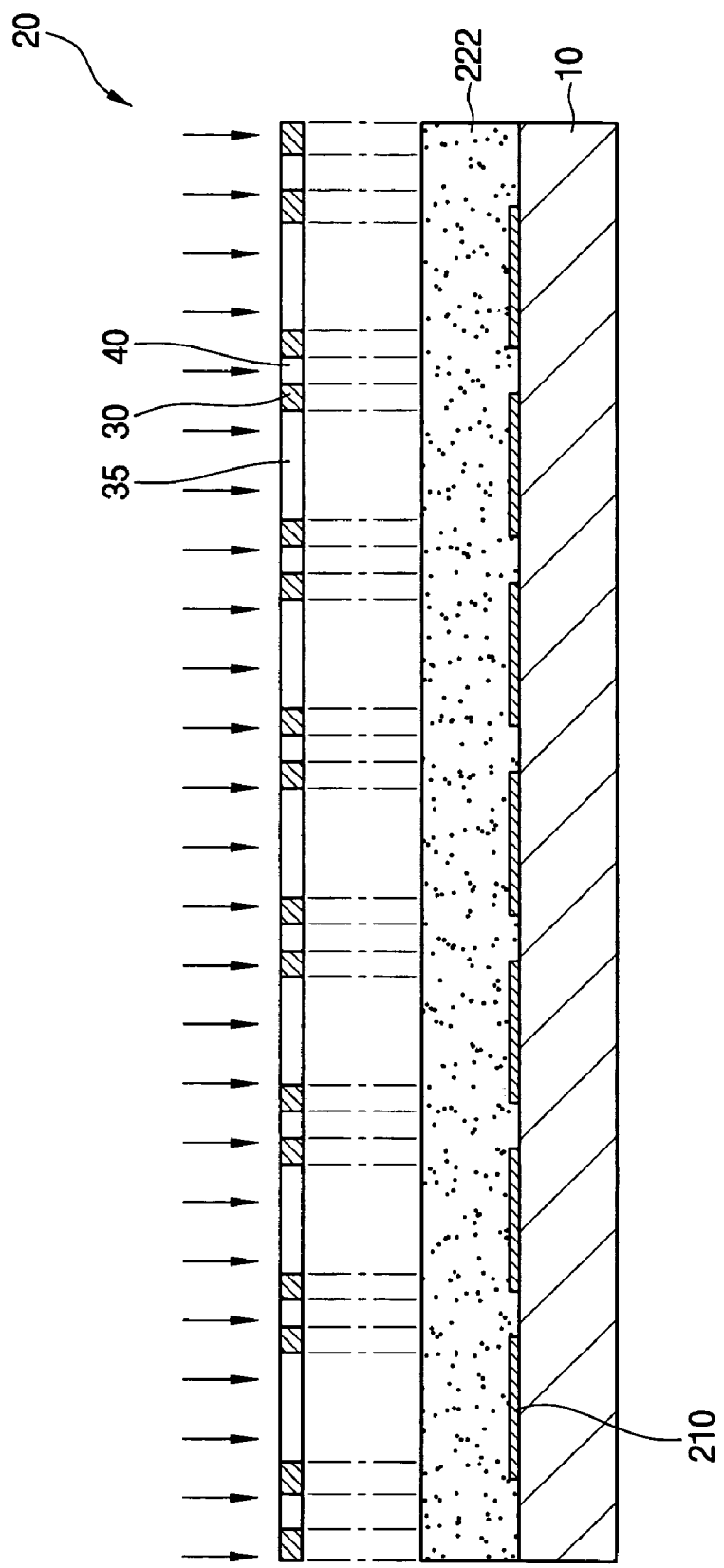
Figure 10C:
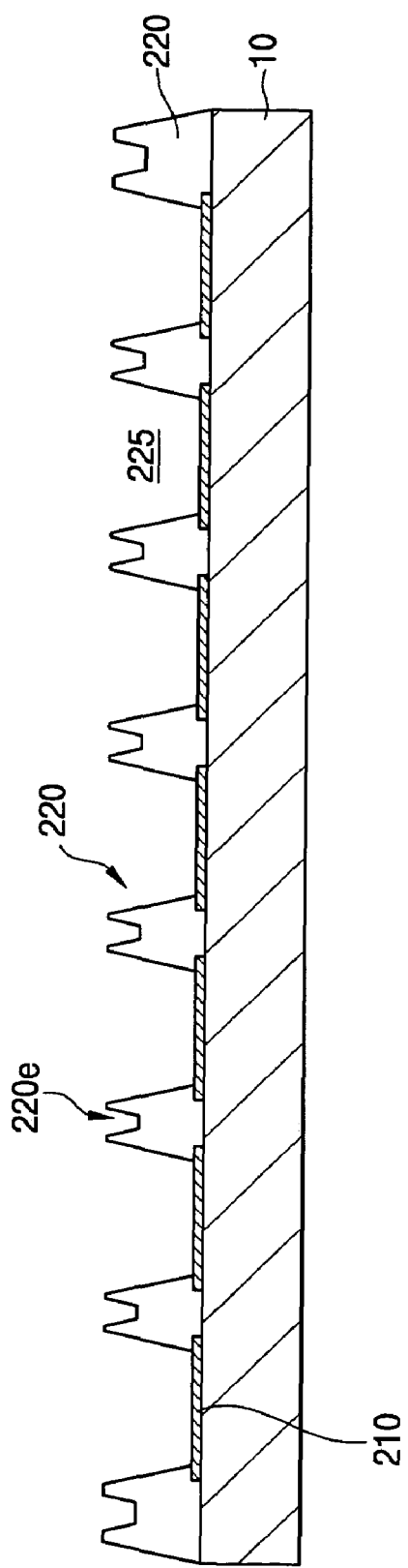

When light that passes through the first and second light-transmitting regions 35 and 40 is irradiated onto a photosensitive layer, and the photosensitive layer is developed, the photosensitive layer corresponding to the first and second light-transmitting regions 35 and 40 are recessed from an upper face of the photosensitive layer to form the cavities 225 and the receiving portions 220e in FIG. 10C, respectively.

When an organic light-emitting material for forming an organic light-emitting layer is dropped onto each of the cavities 225 in FIG. 10C, the receiving portions 220e prevent the organic light-emitting material from flowing into a neighboring cavity.

Additionally, when the photosensitive layer is negative type, a pattern mask may have opposite images to the pattern mask 20 in FIGS. 1 and 2. When the negative type photosensitive layer is developed, a portion of the negative type photosensitive layer, onto which a light is not irradiated, is removed. Therefore, in order to form the cavity 225 and the receiving portion 220e, the pattern mask has opposite image of the light blocking region and the light-transmitting region to that the image of the pattern mask 40 in FIGS. 1 and 2. Therefore, when the photosensitive layer is negative type, the light-blocking region 30 corresponds to a transparent substrate that transmits light, and the first and second light-transmitting regions 35 and 40 correspond to first and second light blocking regions, respectively.

The pattern mask for the negative type photosensitive layer may be formed by printing a light blocking material such as chromium (Cr) on a transparent substrate such as a glass substrate.

Display Apparatus

Figure 3:
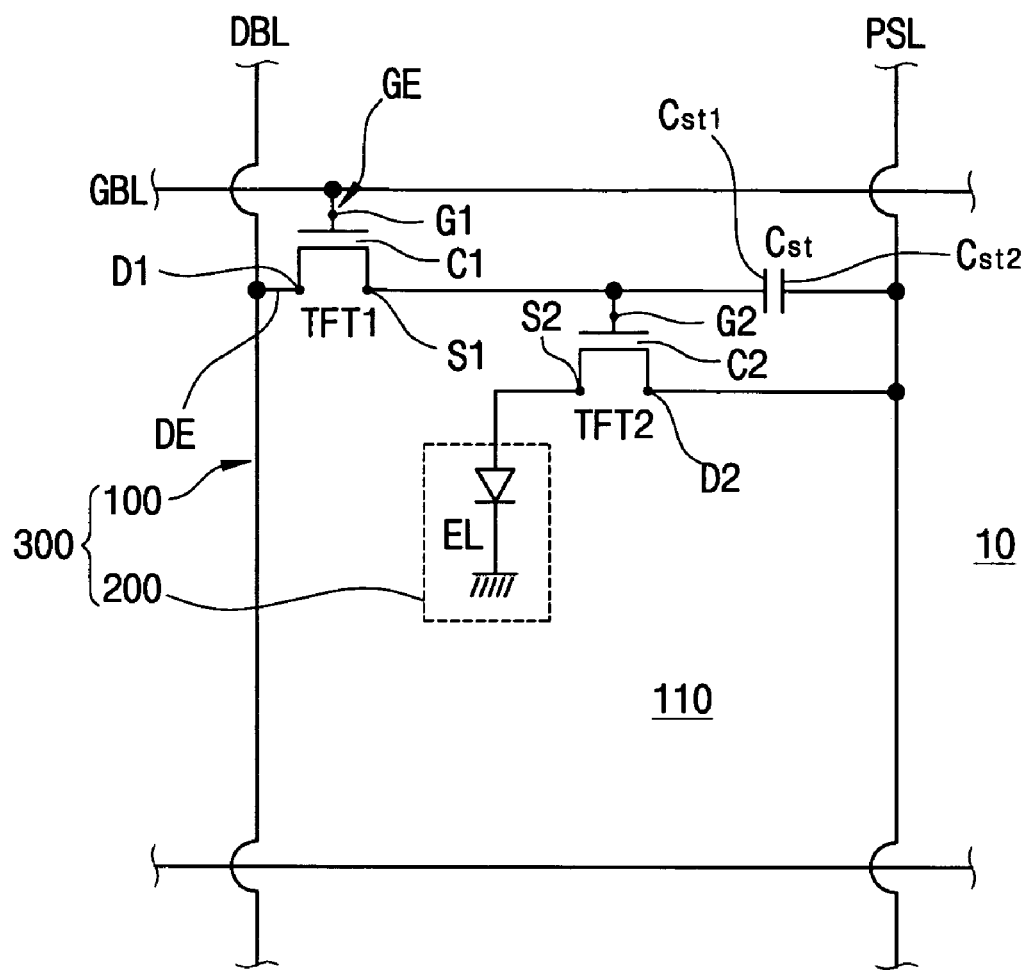
FIG. 3 is an equivalent circuit diagram illustrating a unit pixel of a display apparatus according to an exemplary embodiment of the present invention.
Figure 3:
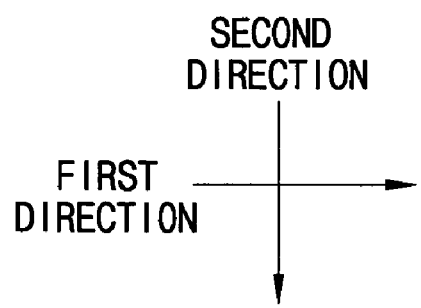

FIG. 3 is an equivalent circuit diagram illustrating a unit pixel of a display apparatus according to an exemplary embodiment of the present invention.

Referring to FIG. 3, a display apparatus 300 includes a circuit unit 100 and a light-emitting unit (or light-emitting device) 200. The circuit unit 100 and the light-emitting unit 200 are formed on a substrate 10.

The circuit unit 100 includes a switching device TFT1, a driver device TFT2, a storage capacitor $C_{st}$, a gate bus line GBL, a data bus line DBL and a power supplying line PSL.

The gate bus line GBL is extended along a first direction. The gate bus line includes a metal having low electric resistance such as aluminum (Al), aluminum alloy, chromium (Cr), chromium alloy, molybdenum (Mo), molybdenum alloy, titanium (Ti), titanium alloy, tantalum (Ta), tantalum alloy, silver (Ag), silver alloy, copper (Cu), copper alloy, etc.

The number of the gate bus line GBL is determined by a resolution of the display apparatus. For example, when a resolution is 1024×768, the display apparatus 300 has 768 gate bus lines GBL.

Each of the gate bus lines GBL is extended in a first direction. The gate bus lines GBL are arranged in a second direction that is substantially in perpendicular to the first direction such that the gate bus lines GBL are substantially in parallel with each other.

Each of the gate bus lines GBLs includes a gate electrode portion GE. The gate electrode portion GE is protruded from the gate bus line GBL in the second direction. For example, when the resolution is 1024×768, 1024×3 units of gate electrode portions GE are protruded from each of the gate bus lines GBL with a substantially same distance.

The data bus line DBL is extended in the second direction. The data bus line DBL includes a metal having a low resistance such as aluminum (Al), aluminum alloy, chromium (Cr), chromium alloy, molybdenum (Mo), molybdenum alloy, titanium (Ti), titanium alloy, tantalum (Ta), tantalum alloy, silver (Ag), silver alloy, copper (Cu), copper alloy, etc.

The number of the data bus line DBL is determined by a resolution. For example, when the resolution is 1024×768, the display apparatus 300 has 1024×3 gate bus lines GBL.

Each of the data bus lines DBL is extended in the second direction. The data bus lines DBLs are arranged in the first direction such that the data bus lines DBLs are substantially in parallel with each other.

Each of the data bus lines DBLs includes a drain electrode portion DE. The drain electrode portion DE is protruded from each of the data bus lines DBL in the first direction. For example, when the resolution is 1024×768, 768 units of gate electrode portions GE are protruded from each of the gate bus lines GBLs with a substantially same distance.

The power supplying line PSL is extended in the second direction such that the power supplying line PSL is spaced apart from the data bus line DBL. A voltage Vdd is applied to the power supplying line PSL.

The switching device TFT1 and the driver device TFT2 are in each of unit pixel regions 110 defined by gate bus lines GBLs adjacent to each other and data bus lines DBLs adjacent to each other.

The switching device TFT1 includes a first gate electrode G1, a first semiconductor pattern C1, a first source electrode S1 and a first drain electrode D1.

The first gate electrode G1 is electrically connected to the gate electrode portion GE protruded from each of the gate bus lines GBLs.

The first semiconductor pattern C1 is disposed over the first gate electrode such that the first semiconductor pattern C1 is electrically insulated from the first gate electrode G1. That is, a first gate insulation layer (not shown) including a dielectric material is interposed between the semiconductor pattern C1 and the first gate electrode G.

The first drain electrode D1 is formed on the first semiconductor pattern C1. The first drain electrode D1 is electrically connected to the drain electrode portion DE protruded from the data bus line DBL.

The first source electrode S1 is spaced apart from the first drain electrode D1. The first source electrode S1 is electrically connected to the first semiconductor pattern C1.

The driver device TFT2 is also disposed in the pixel region 110. The driver device TFT2 includes a second gate electrode G2, a second semiconductor pattern C2, a second drain electrode D2 and a second source electrode S2.

The second gate electrode G2 is electrically connected to the first source electrode S1 of the switching device TFT1.

The second semiconductor pattern C2 is disposed over the second gate electrode G2 such that the second semiconductor pattern C2 is electrically insulated from the second gate electrode G2. That is, a second gate insulation layer (not shown) is interposed between the second gate electrode G2 and the second semiconductor pattern C2.

The second drain electrode D2 is formed on the second semiconductor pattern C2. The second drain electrode D2 is electrically connected to the power supplying line PSL.

The second source electrode S2 is formed on the second semiconductor pattern is C2. The second drain electrode is spaced apart from the second drain electrode D2. The second drain electrode is electrically connected to the light-emitting unit 200.

The storage capacitor $C_{st}$ includes a first capacitor electrode $C_{st1}$, a second capacitor electrode $C_{st2}$ and a dielectric layer. The first capacitor electrode $C_{st1}$ is electrically connected to the second gate electrode G2. The second capacitor electrode $C_{st2}$ is electrically connected to the power supplying line PSL. The dielectric layer is interposed between the first and second capacitor electrodes $C_{st1}$ and $C_{st2}$. The driver device TFT2 may be kept in a turned-on state during one frame period due to the storage capacitor $C_{st}$.

When an image signal and a turn-on voltage are applied to the data bus line DBL and the gate bus line GBL, respectively, the image signal is applied to the first source electrode S1 of the switching device TFT1 through the first drain electrode D1 and the first semiconductor pattern C1 of the switching device TFT1.

Then, the image signal outputted from the first source electrode S1 of the switching device TFT1 is applied to the second gate electrode G2 of the driver device TFT2 to turn on the driver device TFT2. A voltage level of the image signal determines resistance of the second semiconductor pattern C2. When the driver device TFT2 is turned on, the voltage Vdd of the power supplying line PSL is applied to the second source electrode S2 of the driver device TFT2 through the second drain electrode D2 and the second semiconductor pattern C2. The voltage Vdd is dropped in accordance with the resistance of the second semiconductor pattern C2 to output a first driving signal corresponding to the voltage level of the image signal.

Figure 4:
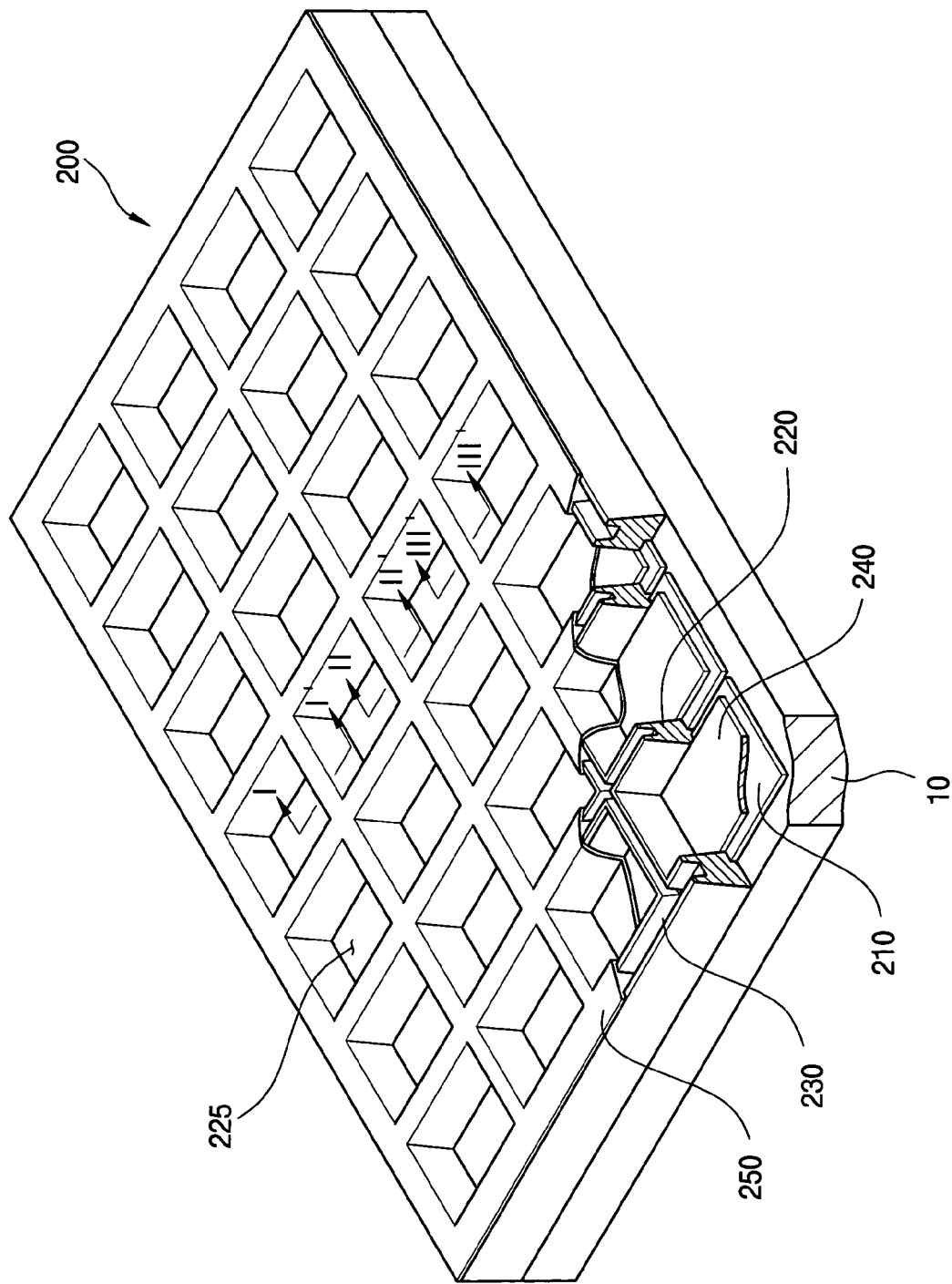
FIG. 4 is a partially cut out perspective view illustrating a light-emitting unit in FIG. 3.

FIG. 4 is a partially cut out perspective view illustrating a light-emitting unit in FIG. 3.

Referring to FIG. 4, the light-emitting unit 200 includes a first electrode 210, a bank 220, a light-emitting layer 240 and a second electrode 250.

The first electrode 210 receives the first driving signal from second source electrode S2 of the driver device TFT2. The first electrode 210 may include an optically transparent and electrically conductive material such as indium tin oxide (ITO), indium zinc oxide (IZO), aluminum (Al), aluminum alloy, silver (Ag), silver alloy, etc. The first electrode 210 and the second source electrode S2 may be electrically connected to each other through a via-hole (not shown).

A plurality of the first electrodes 210 is arranged in a matrix shape on the substrate 10. For example, when a resolution is 1024×768, 1024×768×3 units of the first electrodes 210 are arranged.

The bank 220 is formed on the substrate 10. The bank 220 is disposed between the first electrodes 210. That is, the bank 220 separates the first electrodes 210 from one another. The bank 220 surrounds sides of each of the first electrodes 210 to define a cavity over each of the first electrodes 210.

During forming the light-emitting layer 240 by a light-emitting material, the bank 220 prevents the light-emitting material from flowing into neighboring cavities.

The bank 220 may have various shapes such as a circular shape, a polygonal shape, etc.

Figure 5:
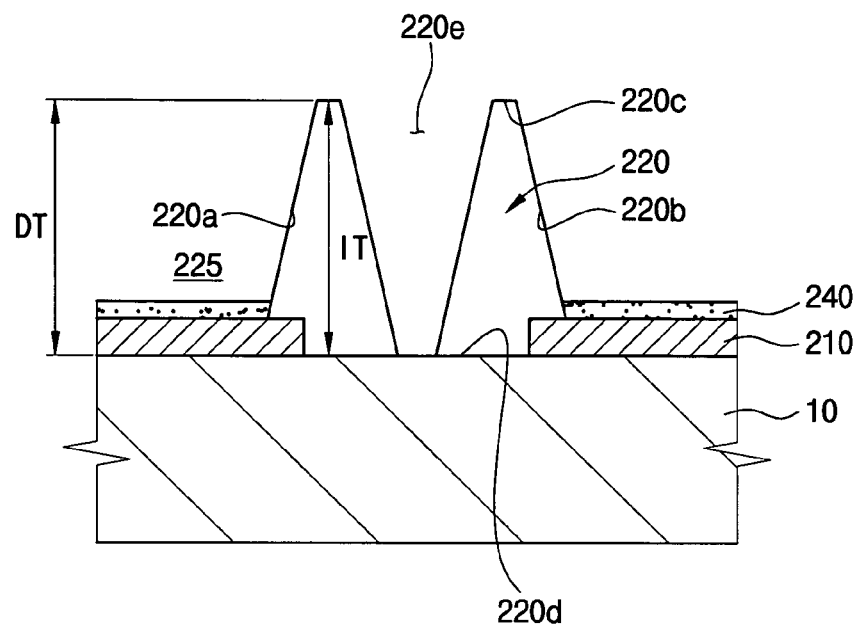
FIG. 5 is a cross-sectional view taken along a line I-I' in FIG. 4.

FIG. 5 is a cross-sectional view taken along a line I-I' in FIG. 4.

Referring to FIG. 5, the bank 220 is formed between the first electrodes 210. A vertical cross-sectional shape of the bank 220 may be a trapezoidal-shape. In detail, the bank 220 includes two side faces 220a and 220b, an upper face 220c, a lower face 220d that is substantially in parallel with the upper face 220c, and a receiving portion 220e. The bank 220 may include a photosensitive material or a photoresist material.

The receiving portion 220e is formed on the upper face 220c. In detail, the receiving portion 220e is recessed from the upper face 220c toward the lower face 220d. A volume of the receiving portion 220e is substantially same or smaller than that of the cavity.

Figure 6:
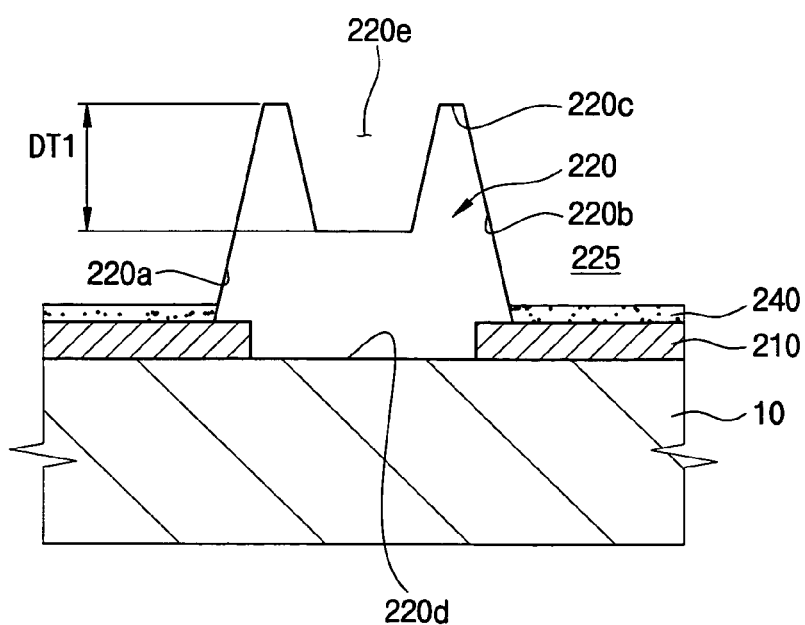
FIG. 6 is a cross-sectional view taken along a line II-II' in FIG. 4.

The receiving portion 220e may have a depth DT that is substantially same as a height IT of the bank 220. That is, the receiving portion 220e exposes the substrate 10. The receiving portion 220e receives the organic light-emitting material that is abnormally dropped. FIG. 6 is a cross-sectional view taken along a line II-II' in FIG. 4.

Referring to FIG. 6, the receiving portion 220e is recessed from the upper face 220c toward the lower face 220d. The receiving portion 220e may have a depth DT1 that is smaller than a height IT of the bank 220. A volume of the receiving portion 220e is substantially same or smaller than that of the cavity.

The receiving portion 220e receives the organic light-emitting material that is abnormally dropped.

Figure 7:
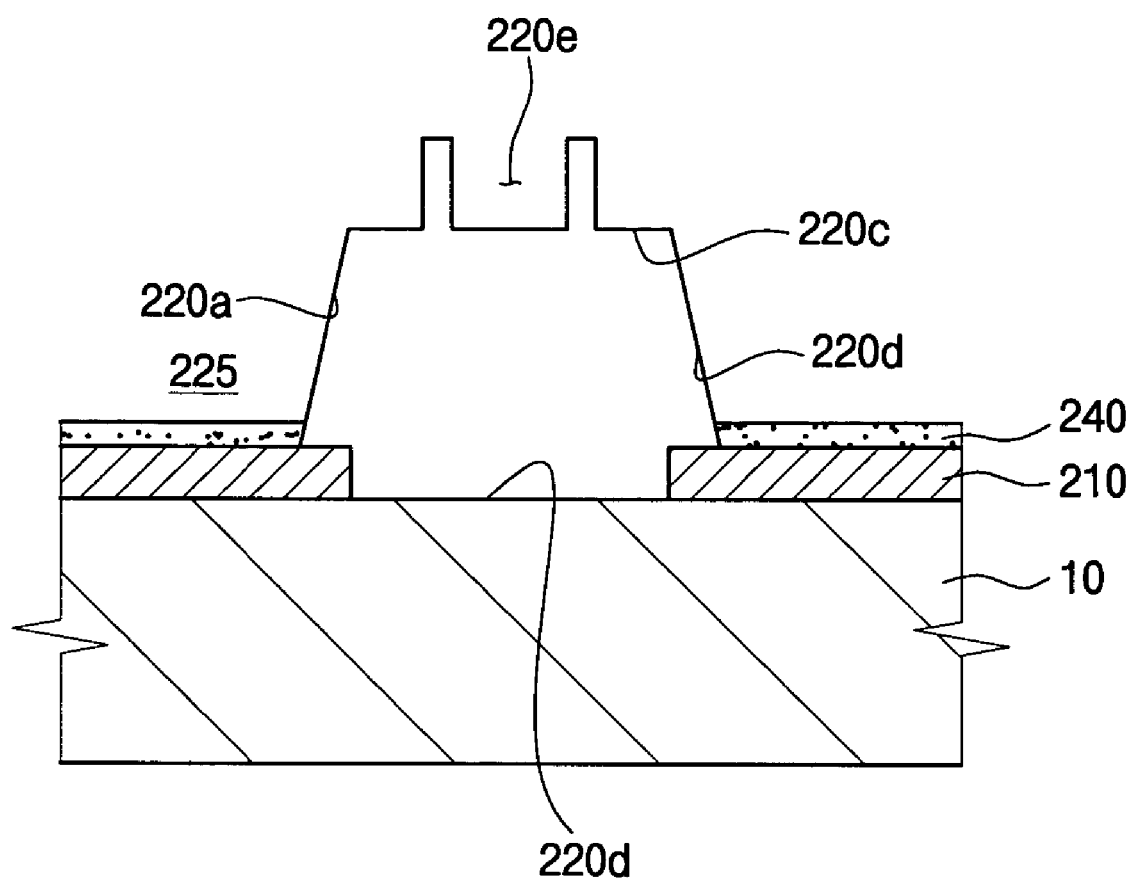
FIG. 7 is a cross-sectional view taken along a line III-III' in FIG. 4.

FIG. 7 is a cross-sectional view taken along a line III-III' in FIG. 4.

Referring to FIG. 7, portions of the bank 220 protrude upward and are substantially in parallel with each other to define the receiving portion 220e. A volume of the receiving portion 220e is substantially same or smaller than that of the cavity.

The receiving portion 220e receives the organic light-emitting material that is abnormally dropped.

Although three different lines I-I', II-II' and III-III' are illustrated in the light emitting unit 200 in FIG. 4, the light-emitting unit 200 in FIG. 4 preferably has the bank 220 having only one kind of the receiving portions 220e in FIGS. 5, 6 and 7. The bank 220 may also have various combinations thereof.

Figure 8:
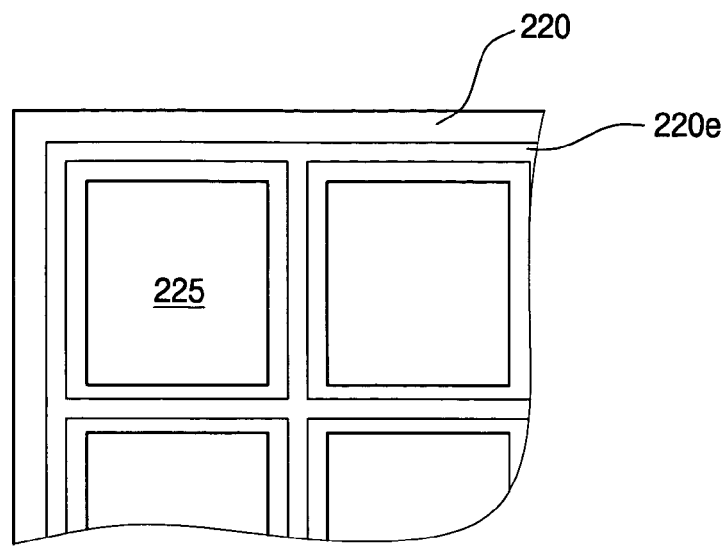
FIG. 8 is a plan view illustrating an exemplary receiving portion having a groove shape and formed at a bank.

FIG. 8 is a plan view illustrating an exemplary receiving portion having a groove shape and formed at a bank.

Referring to FIG. 8, the receiving portion 220e formed on the bank 220 is recessed from the upper face of the bank 220. The bank 220 has a lattice shape. That is, the bank 220 has horizontal portions and longitudinal portions. Each of the horizontal portions and each of the longitudinal portions may be connected to each other. Alternatively, each of the horizontal portions and each of the longitudinal portions may be spaced apart from each other. The recessed portion 220 in FIG. 8 may have thickness smaller than a height of the bank 220.

Figure 9:
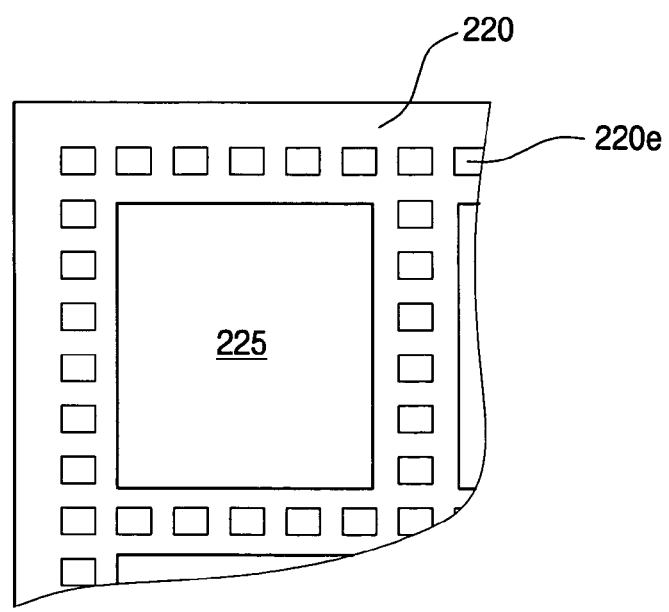
FIG. 9 is a plan view illustrating another exemplary receiving portion having a groove shape and formed at a bank.

FIG. 9 is a plan view illustrating another exemplary receiving portion having a groove shape and formed at a bank.

Referring to FIG. 9, the receiving portions 220e are recessed from the upper face toward to the lower face of the bank 220. The receiving portions 220e are arranged along the horizontal and longitudinal portions of the bank 220. The recessed portion in FIG. 9 may have substantially same thickness as a height of the bank 220.

Referring again to FIG. 4, the light-emitting layer 240 is formed on the first electrode 210.

In this exemplary embodiment, a positive charge carrier injecting layer (not shown) is formed between the first electrode 210, and the light-emitting layer 240 is formed on the positive charge carrier injecting layer.

The second electrode 250 is disposed on the substrate 10 having the first electrode 210, the bank 220 and the light-emitting layer 240 formed thereon such that the second electrode 250 covers the light-emitting layer 240. A negative charge carrier injecting layer (not shown) may further be formed between the light emitting layer 240 and the second electrode 250. A second driving signal is applied to the second electrode 250. The second electrode 250 may include an alkaline metal such as lithium (Li) or an alkaline earth metal such as magnesium (Mg), calcium (Ca) or barium (Ba). The second electrode 250 may also have a double layered structure of the metal layer and a capping layer. The second electrode 250 may be formed through a chemical vapor deposition (CVD) method.

Method of Manufacturing a Display Apparatus by Using a Pattern Mask

FIGS. 10A to 10H are cross-sectional views illustrating a process of manufacturing a display apparatus according to an exemplary embodiment of the present invention.

FIG. 10A is a cross-sectional view illustrating a first electrode formed on a substrate. The substrate 10 includes the circuit unit 100 in FIG. 3 formed thereon. The circuit unit 100 includes a switching device, a driver device, a capacitance, a gate bus line, a data bus line and a power supply line as explained above.

Referring to FIG. 10A, a first electrode 210 is formed on the substrate 10 having the circuit unit formed thereon. The circuit unit 100 of FIG. 3 is omitted in FIG. 10A. The first electrode 210 may include an optical transparent and electrically conductive material such as indium tin oxide (ITO), indium zinc oxide (IZO), etc. In detail, a layer including ITO or IZO is coated on the substrate 10 and patterned to form the first electrode 210.

For example, when a resolution of a display apparatus is 1024×764, 1024×764 units of the first electrodes 210 are formed and arranged in a matrix shape. The first electrodes 210 are spaced apart from one another by a distance G.

FIG. 10B is a cross-sectional view illustrating an exposure process.

Referring to FIG. 10B, a photosensitive layer 222 is formed on the substrate 10 having the first electrode 210 formed thereon. The photosensitive layer 222 may be formed through a spin coating method. The photosensitive layer 222 may have a thickness of about 3 μm.

The pattern mask 20 having the light blocking region 30, and the first and second light-transmitting regions 35 and 40 is arranged over the photosensitive layer 222. Then, the photosensitive layer 222 is exposed through the pattern mask 20.

FIG. 10C is a cross-sectional view illustrating the bank formed on the first substrate.

Referring to FIG. 10C, the exposed photosensitive layer 222 in FIG. 10B is developed to form the bank 220. Alternatively, the bank 220 may not have the photosensitive material. When the bank does not have the photosensitive material, the bank is formed through a photolithography process that has a photo process and an etching process. The bank 220 defines the cavity 225 over the first electrode 210. The bank 220 includes the receiving portion 220e recessed from the upper face of the bank 220. A depth of the receiving portion 220e may be adjusted by changing patterns of the second light-transmitting region 40 in FIGS. 1 and 2.

Figure 10D:
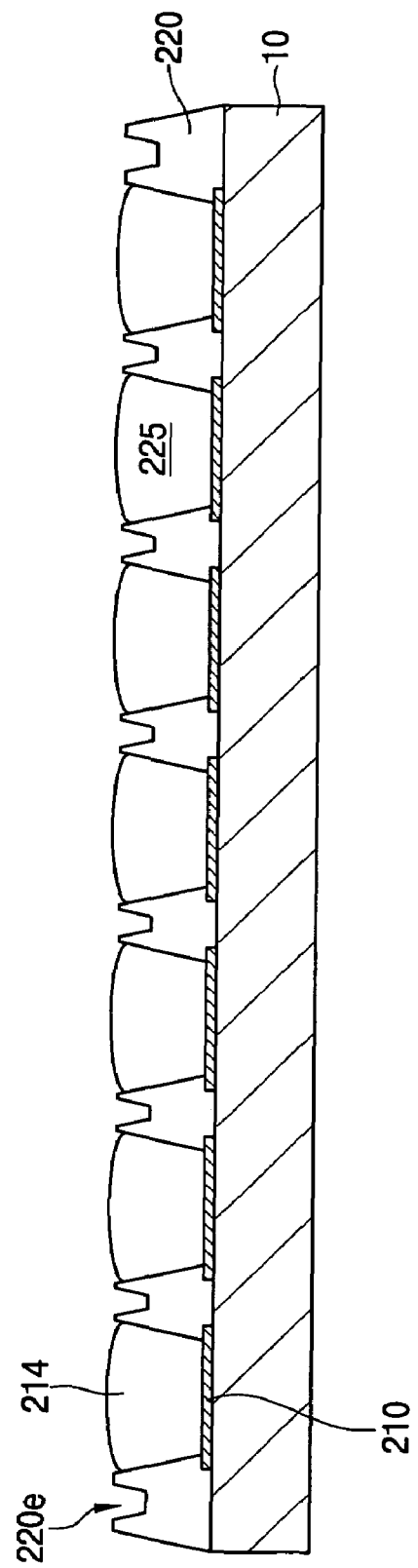
Figure 10E:
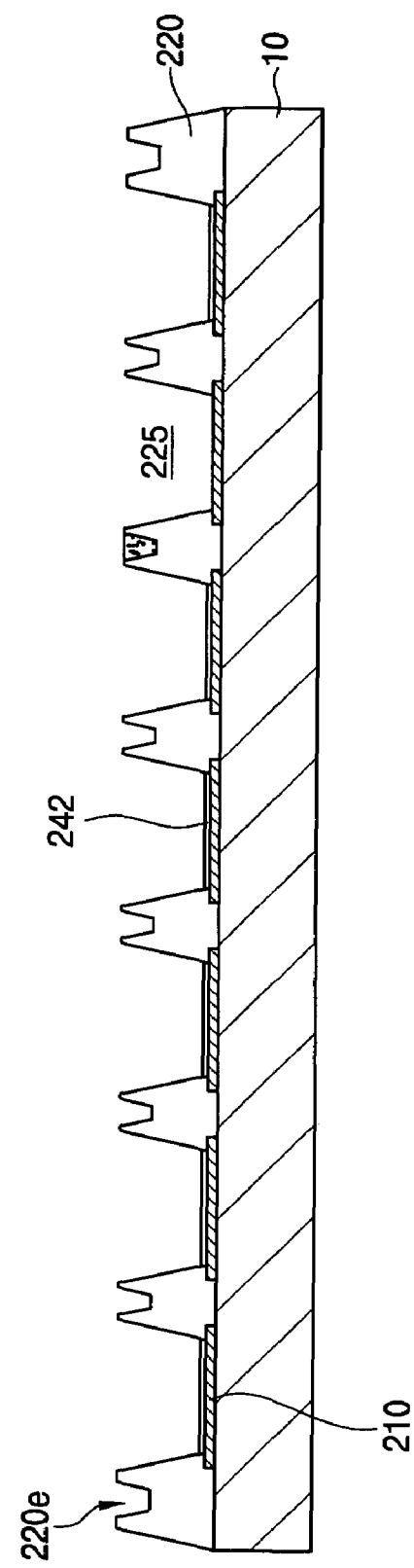

FIG. 10D is a cross-sectional view illustrating a positive charge carrier injecting material having fluidity, which is dropped onto the cavity, and FIG. 10E is a cross-sectional view illustrating a positive charge carrier injecting layer formed on the first electrode.

Referring to FIGS. 10D and 10E, a positive charge carrier injecting material 214 having fluidity is dropped onto the cavity 225 over the first electrode 210. The positive charge carrier injecting material 214 may further include a volatile material, addictives, etc.

Then, the positive charge carrier injecting material 214 is dried. Therefore, a volume of the positive charge carrier injecting material 214 is reduced to form a positive charge carrier injecting layer 242 having a thin film shape.

Figure 10F:
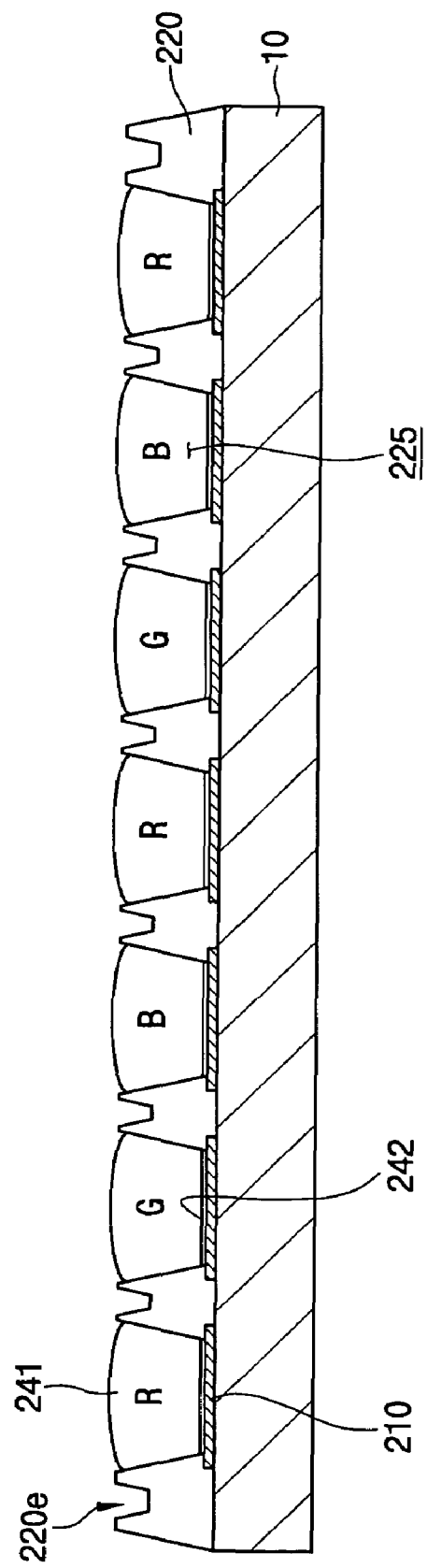
Figure 10G:
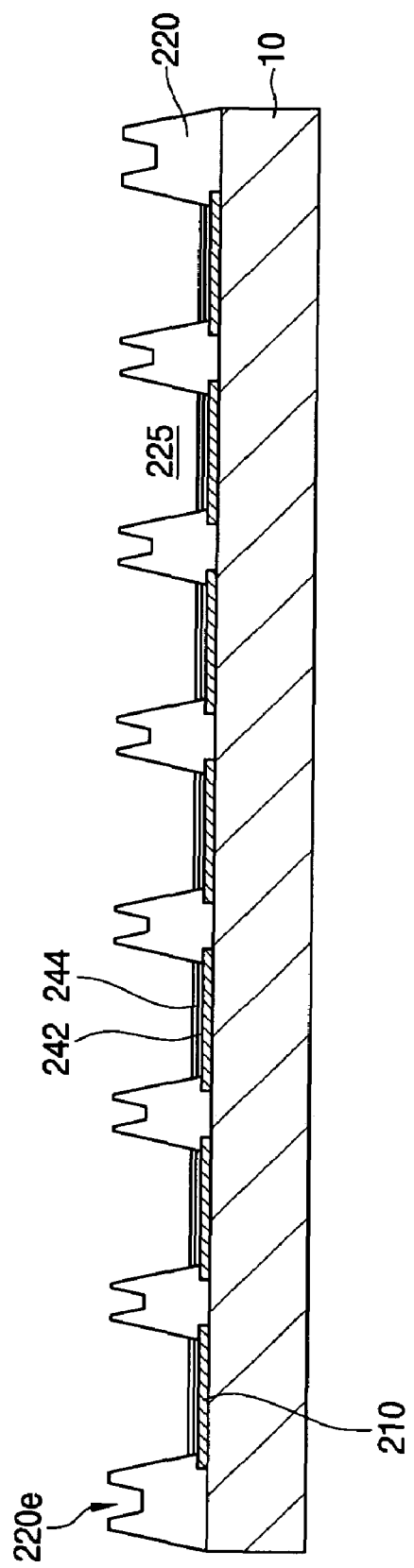

FIG. 10F is a cross-sectional view illustrating a light-emitting material having fluidity, which is dropped onto the cavity.

Referring to FIG. 10F, a light-emitting material 241 having fluidity is dropped onto the cavity 225 over the positive charge carrier injecting layer 242 that is formed on the first electrode 210. The light-emitting material 241 may further include a volatile material, addictives, etc.

Then, the light-emitting material 241 is dried. Therefore, a volume of the light-emitting material 241 is reduced to form the light-emitting layer 244 having a thin film shape.

The positive charge carrier injecting layer 242 and the light-emitting layer 244 form an organic light-emitting layer 240.

Figure 10H:
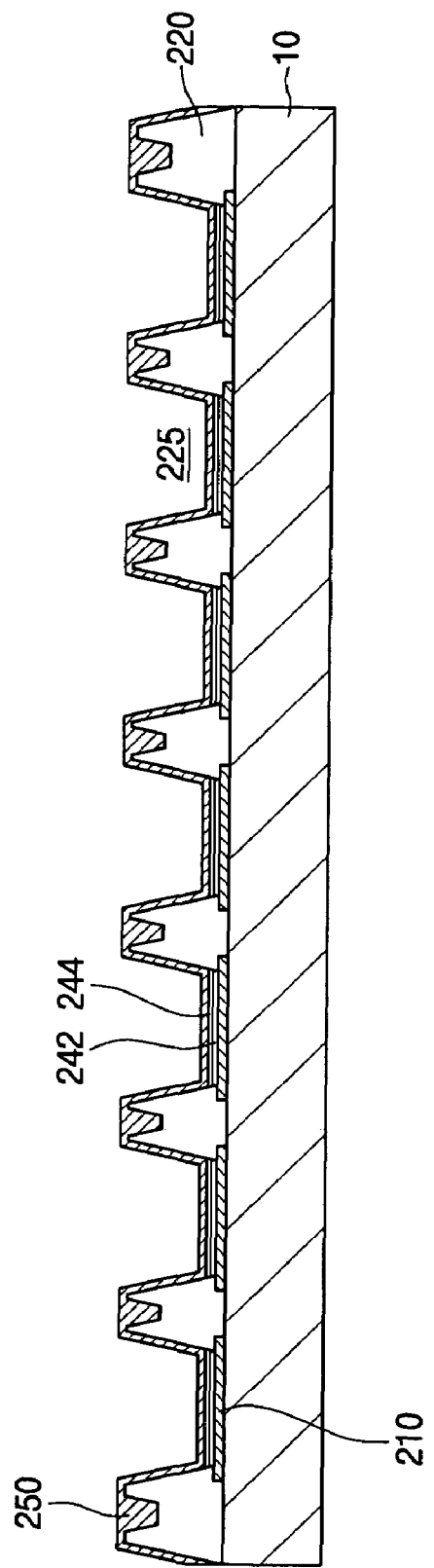

FIG. 10H is a cross-sectional view illustrating a second electrode formed on the substrate having the first electrode, the bank and the organic light-emitting layer.

Referring to FIG. 10H, the second electrode 250 is formed on the substrate 10 having the first electrode 210, the bank 220, the positive charge carrier injecting layer 242 and the light-emitting layer 244. The second electrode 250 may include an alkaline metal such as lithium (Li) or an alkaline earth metal such as magnesium (Mg), calcium (Ca) or barium (Ba). The second electrode 250 may also have a double layered structure of the metal layer and a capping layer.

The second electrode 250 covers the bank 220 and the light-emitting layer 244 so that the second electrode 250 is electrically connected to the light-emitting layer 244. A second driving voltage is applied to the second electrode 250 to display images.

According to the present invention, the bank includes the receiving portion. Therefore, even though the organic light-emitting material is abnormally dropped onto an unintended position, the receiving portion prevents the organic light-emitting material from flowing into a neighboring cavity so that yield of a display apparatus may increases, and a productivity of the display apparatus is enhanced.

Having described the exemplary embodiments of the present invention and its advantages, it is noted that various changes, substitutions and alterations can be made herein without departing from the spirit and scope of the invention as defined by appended claims.

What is claimed is:

1. A display apparatus comprising:
a light-emitting unit including:
a first electrode formed on a substrate, the first electrode configured to receive a first driving signal from a circuit unit;
a bank that surrounds sides of the first electrode, the bank having a receiving portion on an upper face of the bank;
a light-emitting layer formed on the first electrode; and
a second electrode formed on the light-emitting layer, the second electrode configured to receive a second driving signal from the circuit unit, wherein the receiving portion corresponds to a portion recessed from the upper face of the bank such that a depth of the recessed portion is substantially same as a height of the bank.

2. A display apparatus comprising:
a light-emitting unit including:
a first electrode formed on a substrate, the first electrode configured to receive a first driving signal from a circuit unit;
a bank that surrounds sides of the first electrode, the bank having a receiving portion on an upper face of the bank;
a light-emitting layer formed on the first electrode; and
a second electrode formed on the light-emitting layer, the second electrode configured to receive a second driving signal from the circuit unit,
wherein the receiving portion corresponds to a plurality of recessed portions arranged along the first electrode.

3. A display apparatus comprising:
a light-emitting unit including:
a first electrode formed on a substrate, the first electrode configured to receive a first driving signal from a circuit unit;
a bank that surrounds sides of the first electrode, the bank having a receiving portion on an upper face of the bank;
a light-emitting layer formed on the first electrode; and a second electrode formed on the light-emitting layer, the second electrode configured to receive a second driving signal from the circuit unit,
wherein the receiving portion corresponds to portions protruded substantially in parallel with one another.

* * * * *